US007688930B2

(12) United States Patent
Beattie et al.

(10) Patent No.: US 7,688,930 B2
(45) Date of Patent: *Mar. 30, 2010

(54) USING EFUSES TO STORE PLL CONFIGURATION DATA

(75) Inventors: Irene Beattie, Leander, TX (US); Nathan P. Chelstrom, Cedar Park, TX (US); Matthew E. Fernsler, Round Rock, TX (US); Mack W. Riley, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/129,123

(22) Filed: May 29, 2008

(65) Prior Publication Data

US 2008/0225566 A1 Sep. 18, 2008

Related U.S. Application Data

(63) Continuation of application No. 11/245,308, filed on Oct. 6, 2005, now Pat. No. 7,562,272.

(51) Int. Cl.
 *H03D 3/24* (2006.01)
(52) U.S. Cl. .................. 375/376; 702/79; 714/724; 714/726
(58) Field of Classification Search ................ 331/179; 365/225.7, 228; 395/750; 713/183, 184; 714/25, 48, 724, 726
 See application file for complete search history.

(56) References Cited

U.S. PATENT DOCUMENTS 5,446,420 A * 8/1995 Westwick ............... 331/179

| 6,788,156 | B2 * | 9/2004 | Tam et al. ............... 331/49 |
|---|---|---|---|
| 7,158,902 | B2 * | 1/2007 | Damodaran et al. ......... 702/79 |
| 2002/0033757 | A1 * | 3/2002 | Rodgers et al. ......... 340/572.1 |
| 2003/0011417 | A1 * | 1/2003 | Chung et al. ............. 327/277 |
| 2003/0088779 | A1 * | 5/2003 | Kelley et al. ............. 713/184 |
| 2005/0050415 | A1 * | 3/2005 | Anand et al. ............. 714/726 |
| 2006/0284688 | A1 * | 12/2006 | Miki ..................... 331/16 |

OTHER PUBLICATIONS

Cowan et al ("On-Chip Repair and an ATE Independent Fusing Methodology", IEEE, ITC International Test Conference, Paper 7.3, 2002, pp. 178-186).*
Krazit, Tom, "Electrical fuses help IBM chips heal themselves", InfoWorld, Aug. 2, 2004, http://www.infoworld.com/article/04/08/02/HNibmfuses_1.html?source=rss&url=http://w..., pp. 1-4.

(Continued)

*Primary Examiner*—David C Payne
*Assistant Examiner*—Leon-Viet Q Nguyen
(74) *Attorney, Agent, or Firm*—Stephen J. Walder, Jr.; Matthew B. Talpis

(57) ABSTRACT

A mechanism for using electrical fuses (eFuses) to store phase-locked loop (PLL) configuration data are provided. With the mechanism, a portion of the eFuses present in the integrated circuit are reserved for the PLL configuration data. Upon power up, a power up controller and eFuse controller direct the sensing and serial transfer of the data in the portion of eFuses to the PLL under the reference clock. When the transfer is complete, the power up controller directs the PLL logic to load the configuration data and start. The mechanism of the present invention allows manufacturing to tailor the PLL configuration on a given device based on the characteristics of that device and its intended usage. Thus, the same PLL may be used in the same or different architectures to perform different operations based on the configuration data passed into the PLL from the eFuses.

14 Claims, 2 Drawing Sheets

OTHER PUBLICATIONS

"Self-Managing Semiconductors Physically Reconfigure Themselves", IBM Corporation, Press releases, Jul. 30, 2004, http://www-1.ibm.com/press/PressServletForm.wss?MenuChoice=pressreleases&Template.... pp. 1-2.

Cowan et al., "On-Chip Repair and an ATE Independent Fusing Methodology", IEEE, ITC International Test Conference, Paper 7.3, 2002, pp. 178-186.

* cited by examiner

USING EFUSES TO STORE PLL CONFIGURATION DATA

This application is a continuation of application Ser. No. 11/245,308, filed Oct. 6, 2005, status pending.

BACKGROUND OF THE INVENTION

1. Technical Field

The present invention is generally directed to an improved data processing device. More specifically, the present invention is directed to an apparatus and method for using electric fuses (eFuses) to store phase-locked loop (PLL) configuration data.

2. Description of Related Art

In electronics, a phase-locked loop (PLL) is a closed-loop feedback control system that maintains a generated signal in a fixed phase relationship to a reference signal. Since an integrated circuit can hold a complete phase-locked loop building block, the technique is widely used in modern electronic devices, with signal frequencies from a fraction of a cycle per second up to many gigahertz.

Phase-locked loops are used in many different types of applications including frequency synthesizers for digitally-tuned radio receivers and transmitters, demodulation of both FM and AM signals, recovery of small signals that otherwise would be lost in noise, recovery of clock timing information from a data stream, clock multipliers in microprocessors that allow internal processor elements to run faster than external connections while maintaining precise timing relationships, de-skewing of signals, bit synchronization, correcting for jitter, many different types of telecommunications applications, and the like.

For example, some data streams, especially high-speed serial data streams, (such as the raw stream of data from the magnetic head of a disk drive) are sent without an accompanying clock. The receiver may generate a clock from an approximate frequency reference, and then phase-aligns to the transitions in the data stream with a PLL. This is known as clock recovery.

As another example use of PLLs, consider that if a clock is sent in parallel with data, that clock can be used to sample the data. Because the clock must be received and amplified before it can drive the flip-flops which sample the data, there will be a finite, and process-, temperature-, and voltage-dependent delay between the detected clock edge and the received data window. This delay limits the frequency at which data can be sent. One way of eliminating this delay is to include a de-skew PLL on the receive side, so that the clock at each data flip-flop is phase-matched to the received clock.

In yet another example use of PLLs, consider that most electronic systems include processors of various sorts that operate at hundreds of megahertz. Typically, the clocks supplied to these processors come from clock generator PLLs, which multiply a lower-frequency reference clock (usually 50 or 100 MHz) up to the operating frequency of the processor. The multiplication factor can be quite large in cases where the operating frequency is multiple gigahertz and the reference crystal is just tens or hundreds of megahertz.

PLLS may be programmed with default data for controlling the operation of the PLLs. This default data is typically encoded within the PLL circuits themselves. This is a compact solution, but does not provide much flexibility. It is often necessary to change the operation of a PLL so that the PLL performs a different functionality. For example, a PLL's operation may be changed in order to perform different functions, e.g., de-skewing, clock multiplication, correcting for jitter, etc., within the same integrated circuit design, to accommodate a different design architecture, or the like. With an PLL whose default data is encoded in the PLL circuits themselves, a mask change or a metal Engineering Change (EC), i.e. changes to the manufacturing masks that affect the final metal levels of the chip, would be required to change the default values in the PLL. These are costly and time consuming processes.

Another solution is to select the default values from several internally coded choices via pins. This provides a little more flexibility to the PLL but the choices are still limited to those that are internally coded in the PLL. Moreover, this solution uses pins which are at a premium on today's devices. Pins used to select default data within a PLL may not be used to perform other, much needed, functions.

Still a further alternative solution that is more flexible is that the default data may be loaded externally, i.e. from devices external to the integrated circuit chip, at power on time. However, this solution requires additional circuitry outside the device. This results in additional cost and area usage. Furthermore, such a solution requires the use of pins to get the data on-chip. In addition, a ROM, microprocessor, or some other device external to the chip is required to provide the data.

Thus, none of the known solutions provides an adequate PLL circuit that is flexible, does not increase the cost of the circuit, and does not take up additional area than current PLL circuitry.

SUMMARY OF THE INVENTION

In view of the above, it would be beneficial to have an apparatus and method for providing default data to a phase-locked loop (PLL) which is flexible and minimizes cost. Moreover, it would be beneficial to have a mechanism for providing such default data that is on-chip, i.e. on the same chip as the PLL. The present invention provides such an apparatus and method by providing a mechanism for storing PLL default data in electrical fuses (eFuses) of the integrated circuit chip.

An electrical fuse (eFuse) is a simple circuit element that has one of two different states: blown or unblown. As is generally known in the art, the writing of data to eFuses involves the blowing of eFuses to represent a "1" and the leaving of eFuses in their default state, i.e. unblown, to represent a "0" value. In the unblown state, the eFuse enables an electrical contact while in the blown state, the electrical contact is severed. However, the opposite approach may be taken in the case of, for example, inverse eFuses in which blowing of the eFuse actually enables an electrical contact thereby representing a "0" with the default state representing a "1."

Many integrated circuit chips available from International Business Machines, Inc., already include one or more banks of eFuses that are used to provide a self-repair ability to the integrated circuit chip. With eFuses, if an imperfection is detected in the integrated circuit, the appropriate eFuses are tripped, i.e. blown. The activated fuses help the chip control individual circuit speed to manage power consumption and repair unexpected, and potentially costly, flaws. If the technology detects that the chip is malfunctioning because individual circuits are running too fast or too slow, it can "throttle down" these circuits or speed them up by controlling appropriate local voltage. In addition, the eFuses permit tailoring of performance and capabilities of a chip to meet an individual customer's product needs in response to changing end user or software demands. The eFuses are provided in the integrated circuit chips with little if any additional cost to the integrated circuit chips.

The present invention makes use of the eFuses, present on the integrated circuit chip, as a mechanism for providing PLL default data. With the present invention, An apparatus and method for using electrical fuses (eFuses) to store phase-locked loop (PLL) configuration data are provided. With the apparatus and method of the present invention, a portion of the eFuses present in the integrated circuit and on the chip are reserved for the PLL configuration data. Upon power up, a power up controller and eFuse controller direct the sensing and serial transfer of the data in the portion of eFuses to the PLL under the reference clock. When the transfer is complete, the power up controller directs the PLL logic to load the configuration data and start.

The mechanism of the present invention allows manufacturing to tailor the PLL defaults on a given device based on the characteristics of that device and its intended usage. Thus, the same PLL may be used in the same or different architectures to perform different operations based on the default data passed into the PLL from the eFuses. By changing the default data provided to the PLL by way of the eFuses, the PLL may be tailored to the requirements of the customer.

In one exemplary embodiment of the present invention, a circuit is provided that comprises a phase-locked loop (PLL) circuit, an electrical fuse (eFuse) array coupled to the PLL circuit, and a control unit coupled to the eFuse array. The control unit has logic that provides control signals to the eFuse array to cause the eFuse array to provide configuration data to the PLL circuit to thereby configure the PLL circuit to operate with a particular set of characteristics. The control unit may comprise a power-on reset (POR) engine and an eFuse controller coupled to the POR engine. The POR engine may include logic that, in response to receiving a reset signal, sends a control signal to the eFuse controller to sense data values from eFuses in the eFuse array to thereby generate sensed data.

In addition to the above, the circuit may include a latch coupled to the control unit. The sensed data from the eFuses in the eFuse array may be provided to the latch, and the latch may provide the sensed data to the PLL circuit. A decoder may also be provided, coupled to the PLL circuit and the latch. A portion of the sensed data from the eFuses may be provided to the decoder which decodes the portion of the sensed data to thereby generate decoded data. The decoder may provide the decoded data to the PLL circuit.

A scan latch may also be provided, coupled to the latch and the eFuse array. The scan latch may scan-in the sensed data from the eFuse array and provide the sensed data to the latch in response to the latch receiving a control signal from the POR engine.

A clock select multiplexer having a first input for receiving a reference clock and a second input for receiving an output from the PLL circuit may also be provided. The control unit may have logic that sends a clock select signal to the clock select multiplexer to select either the reference clock or the output from the PLL circuit. The control unit may have logic that sends a first clock select signal to the clock select multiplexer to select the reference clock prior to the PLL circuit being configured by the configuration data from the eFuse array. The control unit may have logic that sends a second clock signal to the clock select multiplexer to select the output of the PLL circuit after the PLL circuit has been configured by the configuration data from the eFuse array.

The circuit described above may be provided as part of a microprocessor chip. The circuit may also be provided as part of a data processing device. The data processing device may be an integrated circuit chip, a multi-chip package, a motherboard, a gaming console, a handheld computing device, portable computing device, or non-portable computing device, for example.

In a further embodiment of the present invention, a method is provided in which a phase-locked loop (PLL) circuit is provided, an electrical fuse array coupled to the PLL circuit is provided, and a control unit coupled to the eFuse array is provided. The control unit may have logic that provides control signals to the eFuse array to cause the eFuse array to provide configuration data to the PLL circuit to thereby configure the PLL circuit to operate with a particular set of characteristics.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENTS

The present invention provides a mechanism for programming a phase-locked loop (PLL) circuit with data obtained from one or more electrical fuses (eFuses). Such a mechanism may be provided in an integrated circuit or microprocessor device, for example. While the preferred embodiments of the present invention will be described in terms of the use of eFuses to provide the data for programming the PLL circuit, the present invention is not limited to such. Rather, the mechanisms of the present invention may further be applied to other types of storage devices including laser fuses, standard memory devices, and the like, which may be provided on the integrated circuit device or microprocessor device itself.

Figure 1:
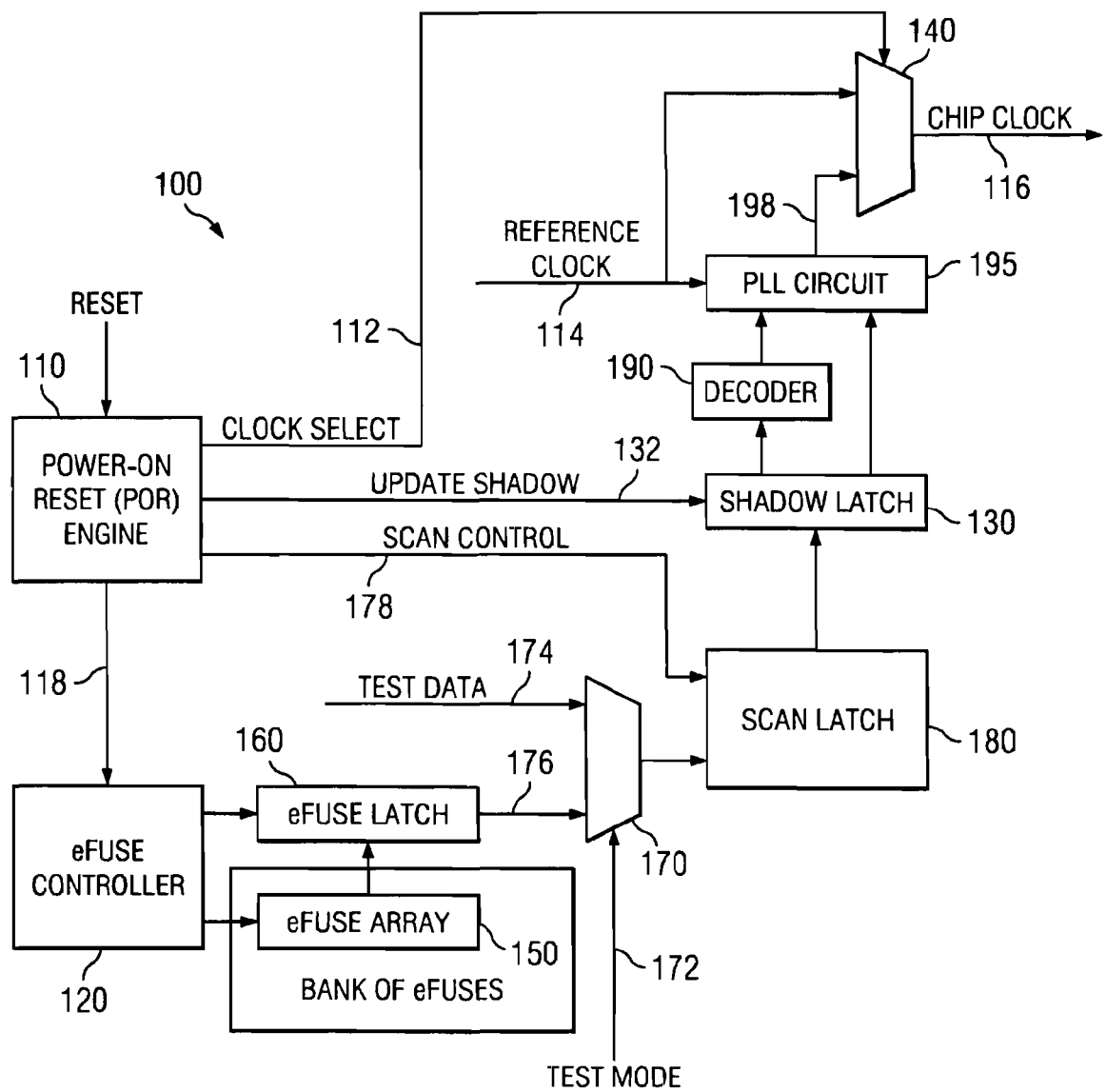
FIG. 1 is an exemplary diagram of a portion of an integrated circuit having a programmable phase-locked loop circuit in accordance with the present invention.

FIG. 1 is an exemplary block diagram of a portion of an integrated circuit in which a programmable PLL is provided. It should be appreciated that the exemplary block diagram shown in FIG. 1 is only one example of the a way in which the mechanisms of the present invention may be implemented. Many modifications to the arrangement of elements shown in FIG. 1 may be made without departing from the spirit and scope of the present invention. The primary requirement of any such alternative arrangement is that it be able to provide PLL default data, or configuration data, to the PLL from an external on-chip built-in storage device, such as a bank of eFuses, laser fuses, or the like.

As shown in FIG. 1, the programmable PLL circuit 100 includes a power-on reset (POR) engine 110 coupled to an eFuse controller 120, a shadow latch 130 and clock select multiplexer 140. The eFuse controller 120 is coupled to an eFuse array 150, or bank of eFuses, and eFuse latch 160. The eFuse latch 160 is in turn coupled to a test mode multiplexer 170 which is coupled to a scan latch 180. The scan latch 180 is coupled to the shadow latch 130 which is in turn coupled to decoder 190 and PLL 195.

In operation, the power-on reset (POR) engine 110 receives a reset signal from an outside source in response, for example, to the microprocessor or integrated circuit in which the programmable PLL is provided being powered on or otherwise reset. Upon receiving the reset signal, POR engine 110 sends a control signal 118 to eFuse controller 120 and a clock select signal 112 to clock select multiplexer 140. The clock select signal 112 is initially set such that the clock select multiplexer 140 selects reference clock 114 as the chip clock 116. The POR engine 110 may include logic and a state machine (not shown) which keeps track of the various states of the PLL initialization operation upon reset and transitions between states of the state machine to control the sending of control signals to the other elements of programmable PLL circuit 100.

The eFuse controller 120, upon receiving the control signal from POR engine 118 sends a control signal to eFuse array 150 to read the eFuses in the eFuse array 150 and output the corresponding bit values to eFuse latch 160. As is generally known in the art, eFuses have a read, or sense mode, and a write mode. A fuse latch in the eFuse serves the function of sensing and storing the fuse value for an eFuse. For more information regarding the way in which eFuses are programmed and read, see Cowan et al., "On-Chip Repair and an ATE Independent Fusing Methodology," ITC International Test Conference, Paper 7.3, pages 178-186, IEEE 2002, which is hereby incorporated by reference.

The values for the eFuses are sensed and stored in eFuse latch 160 and are output by the eFuse latch 160 to test mode multiplexer 170. The test mode multiplexer 170 provides a mechanism for bypassing the eFuse logic during a testing of the circuit. When a test mode signal 172 is asserted on the control input to the test mode multiplexer 170, test data signal 174 is selected. When the test mode signal 172 is not asserted, eFuse data signal 176 from eFuse latch 160 is selected by the test mode multiplexer 170 for output to the scan latch 180.

A scan control signal 178 may be provided by POR engine 110 to control the scanning-in of bits from the eFuse latch 160 into the scan latch 180. Because scan latch 180 scans-in the bits from eFuse latch 160 via multiplexer 170, and it is not desirable to provide a fluctuating or unstable data input to PLL 195, shadow latch 130 is provided for capturing the values in scan latch 180 once all of the default data, or PLL configuration data, is scanned into the scan latch 180 from eFuse latch 160. The updating of shadow latch 130 may be controlled by POR engine 110 by the assertion or de-assertion of an update shadow control signal 132 to shadow latch 130.

The PLL default data, or PLL configuration data, may then be input from the shadow latch 130 to the PLL 195. This input may involve some of the bits of the PLL default, or configuration, data being passed through decoder 190. For example, if more bits than are provided in eFuse array 150, eFuse latch 160, scan latch 180 and shadow latch 130 are needed to provide all of the PLL default, or configuration, data then a portion of the data may be encoded and stored in a portion of the bits provided in the PLL default or configuration data. Of course, if the PLL default or configuration data is not encoded, then decoder 190 may be removed from the arrangement shown in FIG. 1.

For example, consider an eFuse array 150 that comprises an array of 64 eFuses, and thus, provides 64 bits of PLL default or configuration data. The eFuse latch 160 is a 64 bit latch and latches 180 and 130 are also 64 bit latches for capturing the 64 bits of PLL default or configuration data. Suppose that more than 64 bits is necessary for providing all of the information for configuring the PLL 195. As a result, a first portion, such as bits 0-7, of the PLL default or configuration data output by eFuse array 150 may be encoded. This first portion of the PLL default or configuration data may be passed through decoder 190, decoded, and the resulting data provided to PLL 195. The second, unencoded, portion of the PLL default or configuration data may be passed directly from the shadow latch 130 to the PLL 195.

The PLL default or configuration data is received in the PLL 195 and provided to a control unit (not shown) within the PLL 195. The control unit uses the PLL default or configuration data to thereby configure the PLL 195 to perform the desired operations and generate the appropriate clock output 198. The POR engine 110 may assert a clock select signal 112 that causes the clock select multiplexer 140 to select the clock output signal 198 from PLL 195 after configuration of the PLL 195 using the PLL default or configuration data from eFuse array 150.

The PLL default or configuration data may provide information for configuring the PLL 195 to operate in accordance with a desired set of operational characteristics. For example, the PLL default or configuration data may specify what frequency the PLL should achieve, the clock multiplier to be used, what the divisor of the PLL should be, how much reduction in jitter is desired, and the like.

With the mechanisms of the present invention, the operation of the PLL 195 may be modified by changing the PLL default or configuration data output by the eFuse array 150. Thus, by writing a different set of data to the eFuse array 150, different operations, such as different clock multiplier functions, may be obtained to suit the desired implementation of the circuit. This makes the programmable PLL circuit 100 flexible for use with a plurality of different customer requirements, microprocessor architectures, integrated circuit designs, and the like. As a result, a single type of chip may be manufactured to achieve the purposes of a plurality of different customers. The operation of the chip may be tailored to the customer's requirements by simply changing the PLL default or configuration data stored in the eFuse array 150.

In addition, in more complex arrangements, the POR engine 110 may be provided with logic for selecting different PLL default or configuration data for different operations of the PLL with the same chip after installation of the chip. In other words, if a different operation of the PLL is desired after the chip has been installed, the POR engine 110 may send a control signal to eFuse controller 120 to select a different eFuse array from that originally used, to thereby output a different set of PLL default or configuration data to the PLL 195. In such an embodiment, multiple eFuse arrays 150, or portions of an eFuse array, may be reserved for different sets of PLL default or configuration data. As a result, based on differing initial conditions during reset, different operations of the PLL 195 may be obtained.

For example, two customers may want to use the same microprocessor or system on a chip that contains the present invention. Customer A will run the chip in a high performance system at 4 GHz. Customer B will run the chip at 1.7 GHz in a lower performing chip. The present invention allows customized parts to be provided to both customers by simply programming different PLL defaults in the eFuses. Thus, the chip manufacturer will only need to build one microprocessor or system on a chip and simply program the eFuses to customize the chip for each customer.

In another example, it may be determined, during a reset initialization operation, what the power level of an external power source to the chip is, e.g., whether the computing device in which the chip is installed is running on battery power or is plugged into an external source of power. If the power level is a first level, a first set of PLL default or configuration data may be selected from a first eFuse array for use in configuring the PLL 195 to operate with a first clock multiplier. If the power level is a second level, a second set of PLL default or configuration data may be selected from a second eFuse array for use in configuring the PLL 195 to operate with a second clock multiplier. Thus, the mechanism of the present invention permits the switching of PLL operational characteristics from one set of characteristics to another upon reset even after the chip upon which the PLL is built is installed in a data processing device.

Figure 2:
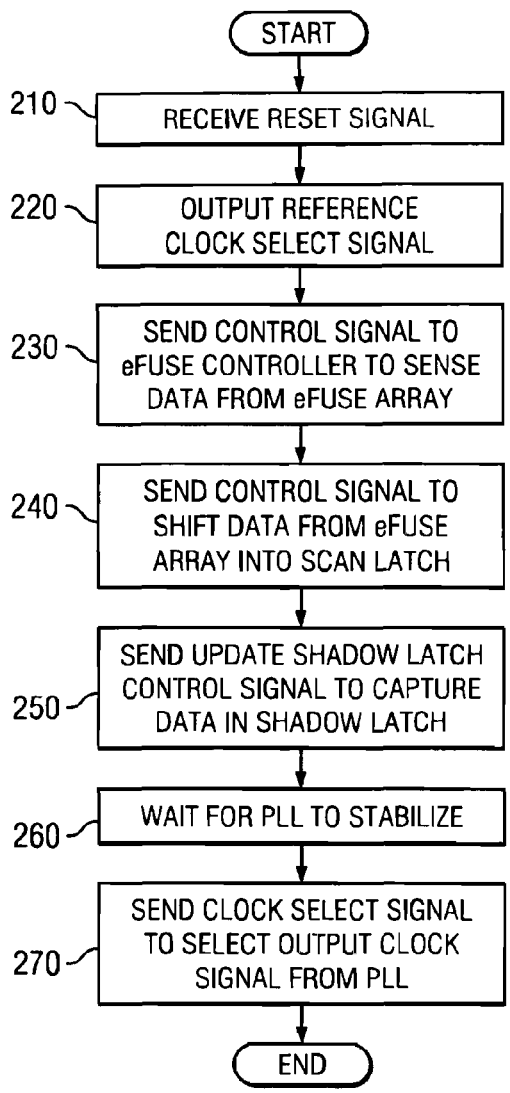
FIG. 2 is a flowchart outlining an exemplary operation of a POR engine according to one exemplary embodiment of the present invention.

FIG. 2 is a flowchart outlining an exemplary operation of a POR engine according to one exemplary embodiment of the present invention. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

As shown in FIG. 2, the operation starts by receiving a reset signal from an outside source (step 210). A reference clock select signal is output to a clock select multiplexer to thereby cause the reference clock to be selected for the chip clock (step 220). A control signal is sent to an eFuse controller to cause a selected set of PLL default or configuration data to be sensed from a portion of a eFuse array (step 230). Control signals are sent to scan latch to shift eFuse supplied PLL default or configuration data into the scan latch (step 240). An update shadow latch control signal is sent to a shadow latch to thereby capture the PLL default or configuration data from the scan latch (step 250). Thereafter, the POR engine waits for a predetermined period of cycles to allow the PLL to stabilize, i.e. lock onto a clock output signal (step 260). Thereafter, the POR engine sends a clock select signal to the clock select multiplexer to thereby select the output of the PLL as the chip clock (step 270). The operation then terminates.

Thus, with the mechanisms of the present invention, a circuit is provided for permitting a programmable PLL to be configured based on default or configuration data supplied from an eFuse array, laser fuse array, or other type of on-chip storage device. The mechanisms of the present invention provide flexibility in the operation of the PLL by providing a mechanism whose stored data is easily modifiable to achieve different operations of the PLL. The mechanisms of the present invention maintain low cost of the circuit by utilizing elements of the integrated circuit that are already present in the integrated circuit but for a different purpose and in a different manner than is conventionally known. Circuitry is provided for coupling the PLL with these already present integrated circuit elements, e.g., eFuses, so as to control the configuring of the PLL using data obtained from these integrated circuit elements.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to gaming consoles, handheld or portable computing devices, and other advanced non-portable computer products having a display, a keyboard or other input device, and a central processor.

Figure 3:
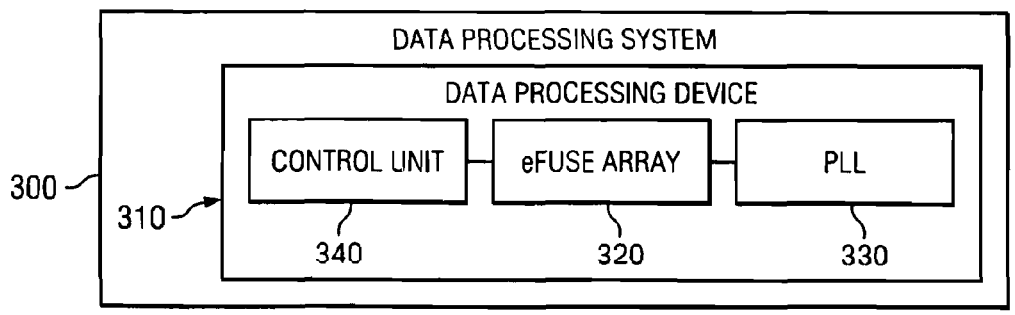
FIG. 3 is an exemplary block diagram illustrating a data processing device in which an eFuse array is used to provide configuration data to a PLL in accordance with an exemplary embodiment of the present invention.

FIG. 3 is an exemplary block diagram illustrating a data processing device in which an eFuse array is used to provide configuration data to a PLL in accordance with an exemplary embodiment of the present invention. As shown in FIG. 3, the e-Fuse array 320 is provided on or in a data processing device 310 in association with a PLL 330 and control unit 340. It should be noted that while the data processing device 310 is illustrated as having a single e-Fuse array 320 coupled to a single PLL 330, the present invention is not limited to such. Rather, multiple e-Fuse array 320 may be provided in association with one or more PLLs 330 in the data processing device 310 in accordance with the present invention.

As mentioned above, the data processing device 310 may be any of a number of different types of data processing devices. Such data processing devices include, but are not limited to, integrated circuit chips, multi-chip packages, motherboards, and the like. The data processing device 310 may be part of a larger data processing system or device 300. This larger data processing system or device 300 may be any type of device utilizing a data processing device 310 ranging from toys and other low-end applications to gaming consoles, handheld or portable computing devices, and other advanced non-portable computing devices, such as desktop computers, servers, or the like.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A circuit, comprising:
a phase-locked loop (PLL) circuit;
an electrical fuse (eFuse) array coupled to the PLL circuit;
a control unit coupled to the eFuse array, wherein the control unit comprises a power-on reset (POR) engine and an eFuse controller coupled to the POR engine; and
a latch coupled to the control unit, wherein:
the control unit has logic that provides control signals to the eFuse array to cause the eFuse array to provide configuration data to the PLL circuit to thereby configure the PLL circuit to operate with a particular set of characteristics specified by the configuration data,
the PLL circuit remains operational after configuring by the configuration data and operates on an input signal based on the particular set of characteristics specified by the configuration data provided by the eFuse array to generate an output signal,
the POR engine includes logic that, in response to receiving a reset signal, sends a control signal to the eFuse controller to sense data values from eFuses in the eFuse array to thereby generate sensed data,
the sensed data from the eFuses in the eFuse array are provided to the latch, and
the latch provides the sensed data to the PLL circuit.

2. The circuit of claim 1, further comprising:
a decoder coupled to the PLL circuit and the latch, and wherein a portion of the sensed data from the eFuses is provided to the decoder which decodes the portion of the sensed data to thereby generate decoded data, and wherein the decoder provides the decoded data to the PLL circuit.

3. The circuit of claim 1, further comprising:
a scan latch coupled to the latch and the eFuse array, wherein the scan latch scans-in the sensed data from the eFuse array and provides the sensed data to the latch in response to the latch receiving a control signal from the POR engine.

4. The circuit of claim 1, further comprising:
a clock select multiplexer having a first input for receiving a reference clock and a second input for receiving an output from the PLL circuit, wherein the control unit has logic that sends a clock select signal to the clock select multiplexer to select either the reference clock or the output from the PLL circuit.

5. The circuit of claim 4, wherein the control unit has logic that sends a first clock select signal to the clock select multiplexer to select the reference clock prior to the PLL circuit being configured by the configuration data from the eFuse array.

6. The circuit of claim 1, wherein the circuit is part of a microprocessor chip.

7. A method, comprising:
providing a phase-locked loop (PLL) circuit;
providing an electrical fuse (eFuse) array coupled to the PLL circuit;
providing a control unit coupled to the eFuse array, wherein the control unit comprises a power-on reset (POR) engine and an eFuse controller coupled to the POR engine; and
providing a latch coupled to the control unit, wherein:
the control unit has logic that provides control signals to the eFuse array to cause the eFuse array to provide configuration data to the PLL circuit to thereby configure the PLL circuit to operate with a particular set of characteristics specified by the configuration data,
the PLL circuit remains operational after configuring by the configuration data and operates on an input signal based on the particular set of characteristics specified by the configuration data provided by the eFuse array to generate an output signal,
the POR engine includes logic that, in response to receiving a reset signal, sends a control signal to the eFuse controller to sense data values from eFuses in the eFuse array to thereby generate sensed data,
the sensed data from the eFuses in the eFuse array are provided to the latch, and
the latch provides the sensed data to the PLL circuit.

8. The method of claim 7, further comprising:
providing a decoder coupled to the PLL circuit and the latch, and wherein a portion of the sensed data from the eFuses is provided to the decoder which decodes the portion of the sensed data to thereby generate decoded data, and wherein the decoder provides the decoded data to the PLL circuit.

9. The method of claim 7, further comprising:
providing a scan latch coupled to the latch and the eFuse array, wherein the scan latch scans-in the sensed data from the eFuse array and provides the sensed data to the latch in response to the latch receiving a control signal from the POR engine.

10. The method of claim 7, further comprising:
providing a clock select multiplexer having a first input for receiving a reference clock and a second input for receiving an output from the PLL circuit, wherein the control unit has logic that sends a clock select signal to the clock select multiplexer to select either the reference clock or the output from the PLL circuit.

11. The method of claim 10, wherein the control unit has logic that sends a first clock select signal to the clock select multiplexer to select the reference clock prior to the PLL circuit being configured by the configuration data from the eFuse array, and wherein the control unit has logic that sends a second clock signal to the clock select multiplexer to select the output of the PLL circuit after the PLL circuit has been configured by the configuration data from the eFuse array.

12. A data processing device, comprising:
a phase-locked loop (PLL) circuit;
an electrical fuse (eFuse) array coupled to the PLL circuit;
a control unit coupled to the eFuse array, wherein the control unit comprises a power-on reset (POR) engine and an eFuse controller coupled to the POR engine, and
a latch coupled to the control unit, wherein:
the control unit has logic that provides control signals to the eFuse array to cause the eFuse array to provide configuration data to the PLL circuit to thereby configure the PLL circuit to operate with a particular set of characteristics specified by the configuration data, the PLL circuit remains operational after configuring by the configuration data and operates on an input signal based on the particular set of characteristics specified by the configuration data provided by the eFuse array to generate an output signal, the POR engine includes logic that, in response to receiving a reset signal, sends a control signal to the eFuse controller to sense data values from eFuses in the eFuse array to thereby generate sensed data, the sensed data from the eFuses in the eFuse array are provided to the latch, and the latch provides the sensed data to the PLL circuit.

13. The data processing device of claim 12, wherein the data processing device is one of an integrated circuit chip, a multi-chip package, a motherboard, a gaming console, a handheld computing device, portable computing device, or non-portable computing device.

14. The circuit of claim 1, wherein the configuration data provided to the PLL circuit to thereby configure the PLL circuit specifies at least one of a frequency of the PLL circuit, a clock multiplier for the PLL circuit, a divisor of the PLL circuit, or a desired amount of reduction in jitter of the PLL circuit.

* * * * *